(12) United States Patent
Anandan (10) Patent No.: US 7,935,963 B2
(45) Date of Patent: May 3, 2011

(54) HYBRID ORGANIC LIGHT EMITTING DIODE

(76) Inventor: Munisamy Anandan, Austin, TX (US)

( * ) Notice: Subject to any disclaimer, the term of this patent is extended or adjusted under 35 U.S.C. 154(b) by 118 days.

(21) Appl. No.: 12/583,541

(22) Filed: Aug. 22, 2009

(65) Prior Publication Data
US 2010/0123150 A1 May 20, 2010

Related U.S. Application Data (60) Provisional application No. 61/199,601, filed on Nov. 18, 2008.

(51) Int. Cl.
*H01L 33/00* (2010.01)
(52) U.S. Cl. ............... 257/40; 257/89; 313/504
(58) Field of Classification Search .......... 250/552; 257/40, 89; 313/504; 438/30, 35
See application file for complete search history.

(56) References Cited

U.S. PATENT DOCUMENTS

| | | | |
|---|---|---|---|
| 2008/0284317 A1* | 11/2008 | Liao et al. | 313/504 |
| 2008/0284318 A1* | 11/2008 | Deaton et al. | 313/504 |
| 2010/0123150 A1* | 5/2010 | Anandan | 257/98 |
| 2010/0187552 A1* | 7/2010 | Lee et al. | 257/98 |

* cited by examiner

*Primary Examiner* — Fernando L Toledo (57) ABSTRACT

A hybrid organic light emitting diode employing fluorescent family of blue light-emitting OLED and phosphorescent family of red and green light emitting OLED, each family being electrically isolated for driving current in to them independent of each other and thus prevent overloading the phosphorescent family when fluorescent family of OLED is driven at high current density. The electrical isolation built in to the device gives long life for the hybrid OLED and yields high brightness. The independent driving also yields additional advantage of varying the color temperature of white light from the device and thus enables the device to function as a variable color OLED lamp.

9 Claims, 5 Drawing Sheets

HYBRID ORGANIC LIGHT EMITTING DIODE

CROSS REFERENCE TO RELATED APPLICATION

Benefit of Provisional application No. 61/199,601 filed Nov. 18, 2008 U.S. Pat. No. 7,494,722 B2 Liao et. al, Feb. 24, 2009

OTHER PUBLICATIONS

References

1. Julie Brown et. al—"Full color phosphorescent OLEDs: Maximizing performance today for small area portable products and tomorrow for TVs", IMID-07 Digest, pp. 427-430
2. Hatwar et. al—"Advances in tandem white OLED architecture for next generation AMOLED display"—IMID-07 Digest of Technical Papers, pp. 231-234
3. J. I. Lee, J. Lee and H. Y. Chu—"Hybrid white OLED for lighting", Proceedings of the Crystal Valley 2008 Conference & Exhibition, pp. 109-112, Sun Moon University, Nov. 11-13, 2008, Asan City, Korea.
4. Jongho Lee—"Current status and outlook of OLED lighting technology", Proceedings of the Crystal Valley 2008 Conference & Exhibition, pp. 137-159, Sun Moon University, Nov. 11-13, 2008, Asan City, Korea.
5. Tomoyuki Nakayama—"Development of phosphorescent white OLED with extremely high power efficiency and long life time", Journal of the Society for Information Display, Vol. 16/2, pp. 231-236, 2008.
6. Yokitoshi Jinde at. al—"Fluorescent RGB and white OLED with high performance", IMID/IDMC-06 Digest, pp. 351-354.
7. Kazuki Nishimura et. al—"New green and red phosphorescent host materials for high efficient long life time OLEDs", SID-09 Digest of Technical papers, pp. 310-313, 2009.
8. Sung-Hoon Pieh et. al—"Two-stacked white organic light emitting diodes consisting of fluorescent and phosphorescent hybrid structure with high efficiency and good color characteristics", SID-09 Digest of Technical papers, pp. 903-906, 2009.
9. Jeffrey P. Spindler et. al—"High efficiency tandem white OLED based on fluorescent emitters", Proceedings of the International Display Research Conference, IDRC-08, pp. 19-22, 2008
10. Liang-Sheng Liao et. al—"Tandem white OLEDs combining fluorescent and phosphorescent emission", SID-08 Digest of Technical papers, pp. 818-821, SID International Symposium 2008.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

1. Field of Invention

The technology of Organic Light Emitting Diode (OLED) consists of three families namely, (i) Fluorescent family (ii) Phosphorescent family and (iii) Polymer family. Each family has its own merits and demerits. Fluorescent family, based on small molecule, has a long life time and hence 90% of the commercial product of OLED technology on the market is based on fluorescent family. Phosphorescent family, based on the dopants of heavy metal-atom-complex such as iridium complex, has the best efficacy but does not possess long life, especially the blue color OLED. Polymer family, based on long molecule, has the potential for low cost in manufacturing but does not have long life. Recently the focus is more on fluorescent and phosphorescent families. By combining the two technologies of both families, it is possible to derive the benefit of both families namely, good efficacy and long life.

For flat panel display application of OLED, there are two methods that are employed. One method is to incorporate discrete red pixel, discrete blue pixel and discrete green pixel of OLED and drive these pixels to generate full color video images. The other method is to incorporate white OLED pixels, consisting of the mix of red-blue-green OLED, and employ red, blue and green color filters over the white OLED layer. By selectively energizing these pixels, full color video images can be displayed.

Another important field of application for OLED is General lighting. High luminance of around 20,000 cd/m$^2$ is required for application in lighting. To obtain this high luminance, the current density in OLED can reach 30-40 mA/cm$^2$. At this current density, OLED should possess long life. But it is not the case. OLED is known to exhibit short life at high current density and long life at low current densities. Operating OLEDs at low current density and still obtaining high luminance is possible by connecting several OLEDs in series. A monolithic series OLED is also a routine process being done in the name of 'tandem OLED'. Applications like lighting and displays demand long life, high efficacy and high brightness, coupled with low price, from OLEDs. To meet this demand, a combination of the advantages of all the three families of OLED can be exploited.

2. Description of Prior Art

The life of white OLED from fluorescent family and phosphorescent family is given in Table I and Table II. Table I shows that OLED, from phosphorescent family that emits blue light, has a life time of 3000 hours when life-tested with a starting luminance of 500 cd/m$^2$. The OLED from fluorescent family that emits blue light, has a life time of 12000 hours when life tested with a starting luminance of 1000 cd/m$^2$. It is well known that the luminance increases with current density. Thus it is clear that the blue light emitting OLED from phosphorescent family will have poor life if the starting luminance is increased to 1000 cd/m$^2$ instead of 500 cd/m$^2$. The efficacy of phosphorescent OLED that emits blue light is higher than that of the blue light emitting OLED from the fluorescent family. Table II gives the life time of white OLED from phosphorescent family and fluorescent family. The data in the first two rows represent the white light emitting OLED that contains red, blue and green light emitting layers. The data in the last row represents the white light emitting OLED that contains both the families of OLED in that blue light emitting layer is made out of fluorescent family and red+green (yellow) light emitting OLED is made out of phosphorescent family. It is clear that pure phosphorescent white OLED has high efficacy of 64 lm/w, but has a life of only 10,000 hours when the starting luminance for life test is set at 1000 cd/m$^2$. The pure fluorescent white OLED on the other hand has a long life of 50,000 hours but the efficacy is only 19.5 lm/w. The hybrid white OLED that contains the fluorescent family and the phosphorescent family has life time and efficacy in between that of pure fluorescent and pure phosphorescent family.

TABLE I

Blue OLED

| OLED Family | Blue (x, y) | Initial Luminance | Efficacy | Life (50% of initial luminance) |
|---|---|---|---|---|
| Phosphorescent (Ref: 1) | x = 0.16; y = 0.29 | 500 cd/m$^2$ | 11 cd/A | 3000 Hrs |
| Fluorescent (Ref: 6) | x = 0.14; y = 0.16 | 1000 cd/m$^2$ | 7.2 cd/A | 12000 Hrs |

TABLE II

White OLED

| OLED Family | White (x, y) | Initial Luminance | Efficacy lm/w | Estimated functional Life (50% of initial luminance) |
|---|---|---|---|---|
| Phosphorescent (Ref: 5) | x = 0.37 y = 0.42 | 1000 cd/m$^2$ | 64 | 10,000 Hrs |
| Fluorescent (Ref: 9) | x = 0.28; y = 0.33 | 1000 cd/m$^2$ | 19.5 | 50,000 Hrs |
| Phosphorescent-Fluorescent Hybrid (Ref: 8) | x = 0.368 y = 0.385 | 1000 cd/m$^2$ | 30 | 31,000 Hrs |

The life test procedure for OLED is typically as follows:
(i) Set the initial luminance of 1000 cd/m$^2$ and in DC drive condition operate the OLED continuously.
(ii) Monitor the luminance after 24 hours and thereafter at interval of 100 hours.
(iii) Continue life test for 1000 hours and plot the luminance vs time for 1000 hours.
(iv) From the trend line, extrapolate the curve to reach 50% of the initial luminance of 1000 cd/m$^2$.
(v) Estimate the life based on 50% level.
(vi) Since the test is continuous and the real functional life is not continuous, use an empirical power law of 1.5, for the life estimated for 50% level, and arrive at the final estimated life.

The number of hours reported in Table I and II is based on the above procedure.

For obtaining white light from OLED, the practice in the industry is to employ hybrid white OLED (HW-OLED) that contains fluorescent family for blue light emission and phosphorescent family for yellow (red+green) light emission. This yields long life typical of fluorescent family and high efficacy typical of phosphorescent family. This is the Prior art. For applications in illumination and application in TV, the luminance requirements are higher than reported in Table I and Table II. For example a compact fluorescent lamp yields a luminance of 20,000 to 30,000 cd/m$^2$. For TV application the final screen should yield a luminance of 500 cd/m$^2$ but to obtain this luminance, with anti-reflection coating and color filters intervening the viewer and OLED, the OLED need to yield a luminance >2000 cd/m$^2$. To obtain higher luminance from the structure of HW-OLED the current density needs to be increased. The ratio of green:red:blue in white light is 64%:28%:8%. The luminous flux in all these three colors needs to increase in the same ratio. The current density required to increase the flux in blue light emission from fluorescent family is in the range of 10 mA/cm$^2$ to 20 mA/cm$^2$. This current density is too high for the materials emitting yellow (red+green) light from the phosphorescent family and the life of the phosphorescent materials will deteriorate resulting in poor life of HW-OLED. Materials from the phosphorescent family exhibit satisfactory life when operated below a current density of 7 mA/cm$^2$. If the current density is increased to the same level as the blue light emitting fluorescent layer, the increase in the luminous flux from yellow light (red+green) will far exceed the ratio specified for white and thus the chromaticity will go out of control, in addition to shortening of life. Even at low current density (<7 mA/cm$^2$) of operation, doping control during the processing needs to be accurately executed to maintain the chromaticity. These are the drawbacks of the prior art. The industry is not able to find any solution for this problem to-date.

SUMMARY OF THE PRESENT INVENTION

According to the present invention, the problem facing the industry on increasing the luminous flux of HW-OLED without interfering with the life-performance of phosphorescent materials is solved through a novel structure of HW-OLED. The structure comprises both the families of OLED namely, phosphorescent family and fluorescent family with fluorescent family emitting blue light and phosphorescent family emitting red and green light. The uniqueness in the structure is the electrical isolation of these two families. The structure can be monolithically fabricated with the existing manufacturing methods. The luminous flux in the blue region of light can be added or subtracted on demand without affecting the phosphorescent OLED. Similarly the luminous flux in the red and green region of light can be added or subtracted without affecting fluorescent OLED. Due to these advantages, the color temperature of the resulting white light can be varied. Hence the structure of the present invention can be used in obtaining variable color temperature OLED lamp. The electrical isolation lends itself to obtain a long lasting OLED lamp with high brightness and efficacy. The unique structure of the present invention can be fabricated in multiples on a single flat substrate. The multiple devices can be connected in series or parallel to further increase the area and the luminous flux of the resulting OLED lamp.

It is an object of this invention to provide a unique novel structure of hybrid organic light emitting diode that comprises materials from phosphorescent family of OLED as well as from the fluorescent family of OLED A further object of this invention is to provide, in the novel structure of hybrid OLED, electrical isolation between the layers of OLED of phosphorescent family and the layers of OLED of fluorescent family.

Yet another object of this invention is to provide an OLED lamp, through the novel structure, whose color temperature can be varied on demand.

BRIEF DESCRIPTION OF DRAWINGS

FIG. 02A is the cross sectional view of the novel structure according to the present invention.

FIG. 02B is the electrical equivalent circuit of the cross sectional structure shown in FIG. 02A.

FIG. 03 is the cross sectional view of another embodiment of the present invention.

FIG. 04A is a plan view of the monolithic structure depicting the fabrication of layers according to the present invention.

FIG. 04B is the cross sectional view taken from FIG. 04A.

FIG. 05A is the cross sectional view of sealed device according to the present invention showing the light output towards the top and bottom direction.

FIG. 05B is the cross sectional view of sealed device according to the present invention showing the light output towards the bottom direction.

FIG. 05C is the cross sectional view of sealed device according to the present invention showing the light output towards the top direction.

DETAILED DESCRIPTION OF DRAWINGS

Figure 01:
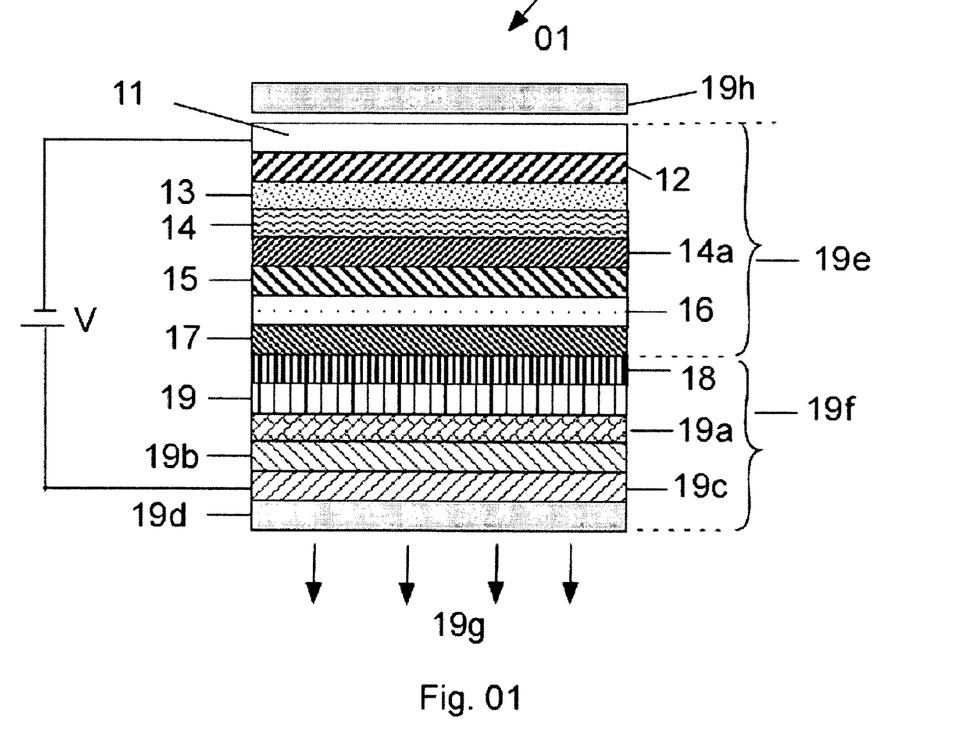
FIG. 1 shows the cross sectional view of hybrid white OLED (HW-OLED) adopted in the prior art [ref. 8].

FIG. 01 illustrates the cross sectional structure of HW-OLED according to the prior art. Between two glass substrates 19d and 19h are contained organic layers and inorganic layers belonging to the two families of OLED. The stack of layers shown as 19e belongs to the phosphorescent family and the stack of layers shown as 19f belongs to the fluorescent family. The substrates 19h and 19d are hermetically sealed together and the seal is not shown in FIG. 01 for simplicity. Over the bottom substrate 19d is transparent anode layer 19c. On top of this layer is an organic layer 19b that injects holes (positive charges) in to the structure and is called hole-injection layer. Following this layer is another organic layer 19a called hole-transport layer. Over the hole-transport layer is the blue light emission layer 19 that contains a host layer and dopant (not shown in FIG. 01) from fluorescent family. Following this blue light emitting layer is an electron transport layer 18 followed by a charge generation layer 17. Over the charge generation layer 17 is a hole-injection layer 16 followed by a hole-transport layer 15. Over the hole-transport layer 15 is formed an 'exciton' blocking layer 14a followed by an yellow light emission layer 14 that contains a host layer with a combination of red and green dopants (not shown in FIG. 01). The materials contained in the yellow emission layer are from the phosphorescent family. Followed by the yellow light emitting layer 14 is an electron transport layer 13 which in turn is followed by an electron injection layer 12. Over the electron injection layer 12 is formed a reflective cathode layer 11.

Electrical connections to the anode layer 19c and cathode layer 11 are suitably brought out (not shown in FIG. 01) and a voltage in the range of 3 V to 10 V can be applied between the anode and cathode to pass suitable current through the device for light emission. When the voltage is applied the electrons from the cathode and holes from the anode are injected in to the host layers to pair themselves inside the host layers to form 'excitons' of the host molecules. These 'excitons' transfer energy to the dopant that gets excited in to its excited state and then return to the ground state. This transition to the ground state results in light emission that is characteristic of the dopant molecule. The fluorescent based blue light emitting layer 19 emits blue light and similarly the phosphorescent based yellow light emitting layer 14 emits yellow light. These two colors of light are mixed together inside the device to yield white light emission. In the illustration shown, the substrates 19h, 19d and the anode layer 19c are optically transparent. The cathode layer 11 is reflective. Hence the white light 19g comes out through the bottom substrate 19d.

In the illustration shown in FIG. 01, the same amount of current passes through blue light-emitting layer and the yellow light-emitting layer. For obtaining high luminance in the rage of 5000-10,000 cd/m$^2$ the current density needs to be high (in the range of 10-20 mA/cm$^2$) for sufficient blue light-emission from the fluorescent based blue light emitting layer 19. The current density needed for blue light-emitting layer is too high for yellow light-emitting layer 14 that comprises materials from the phosphorescent family. Hence the yellow light-emitting layer will degrade in their light emission capacity faster than blue light-emitting layer. Thus the life of the device shown in FIG. 01 is short.

Figure 02A:
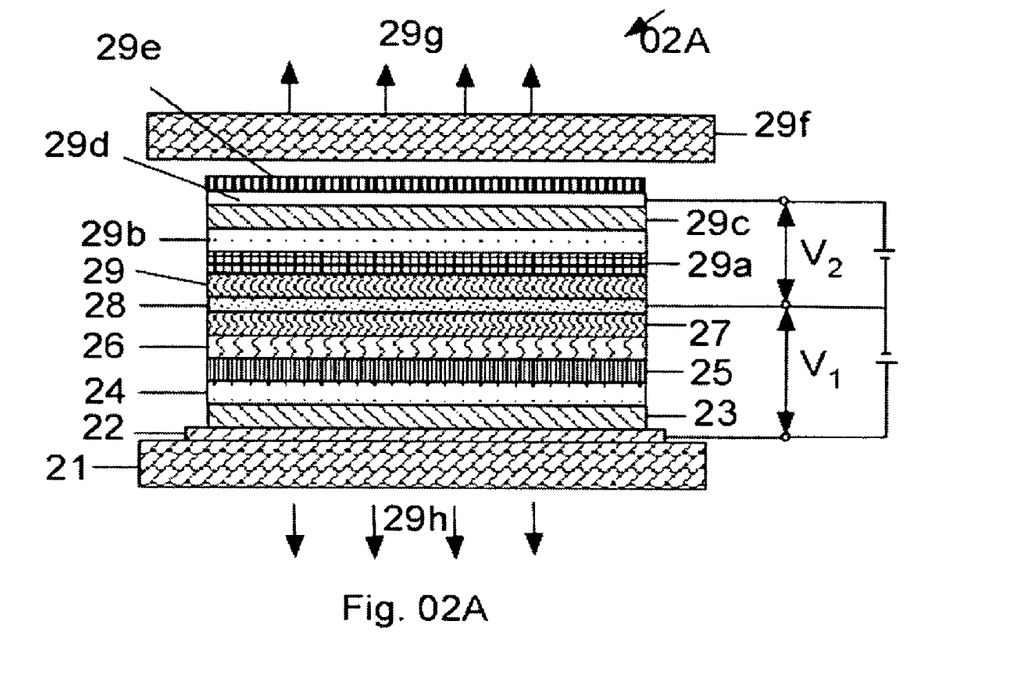

FIG. 02A is a cross sectional view of the novel structure of HW-OLED according to the present invention. Multi-layers of organic and inorganic materials are contained between bottom substrate 21 and top substrate 29f. Both the substrates are transparent. Both the substrates can be rigid or flexible or bendable or one substrate being rigid and the other substrate being either flexible or bendable. In the illustration shown in FIG. 02A the two substrates 21 and 29f are transparent and rigid.

Starting from the bottom, an anode layer 22 that can be either transparent or reflective (transparent in the illustration in FIG. 02A) is formed over substrate 21 either through sputtering or vacuum deposition process. The material of the anode layer can be either metal or metal oxide of high work function in the range of 4 eV to 5 eV with a thickness in the range of 50 nm to 500 nm. (None of the drawings are made to the scale). Over this layer is deposited an organic layer 23, called hole-injection layer, through either vacuum evaporation or printing or spin-coating or through vapor phase deposition process with thickness in the range of 10 nm to 100 nm. This layer injects holes (positive charges) in to the stack of organic layers upward. On top of the hole-injection layer is the hole-transport layer 24 that transports holes in to the stack of organic layers upward. The hole-transport layer 24 is deposited through either vacuum evaporation or printing or spin-coating or coating through vapor phase deposition process with thickness in the range of 10 nm to 100 nm. On top of the hole-transport layer 24 is a host layer 25 that belongs to the phosphorescent family of OLED with phosphorescent doping (heavy metal-atom-complex) to emit red light when electrons and holes recombine in this layer. This layer can also be either vacuum evaporated or printed or spin-coated or coated through vapor phase deposition process with thickness in the range of 10 nm to 100 nm. Over the red light emitting layer 25 is the host layer 26 that belongs to the phosphorescent family of OLED with phosphorescent doping to emit green light when electrons and holes combine in this layer. This layer can also be either vacuum evaporated or printed or spin coated or coated through vapor phase deposition process with thickness in the range of 10 nm to 100 nm. The layers 25 and 26 can also be interchanged in their position in the stack. Layers 25 and 26 can also be combined in to one host layer and doped with a combination of phosphorescent based red and green dopant to emit a mixture of green and red light (yellow light). Over the green light emitting layer 26 is deposited an electron transport layer 27 that transports electrons to the green and red light emitting layers. This layer can also be either vacuum evaporated or printed or spin coated or coated through vapor phase deposition process with thickness in the range of 10 nm to 100 nm. Over the electron transport layer 27 is deposited a transparent cathode layer 28 made of metal or mixtures of metal or metal oxide of low work function, preferably less than 3 eV, to emit electrons and inject them in to the electron transport layers 29 and 27 that are contacting the cathode layer 28 on top and bottom side. The preferred thickness of transparent cathode layer is less than 10 nm. Over the electron transport layer 29 is deposited a blue light emitting host-layer 29a that belongs to the fluorescent family of OLED doped with a blue light emitting fluorescent doping. This layer can also be either vacuum evaporated or printed or spin coated or coated through vapor phase deposition process with thickness in the range of 10 nm to 100 nm. Over this blue light emitting host layer is deposited a hole-transport layer 29b that transports holes down to the blue light emitting layer 29a. This layer can also be either vacuum evaporated or printed or spin coated or coated through vapor phase deposition process with thickness in the range of 10 nm to 100 nm. Over this hole-transport layer is deposited a hole-injection layer 29c that injects holes in to the hole-transport layer 29b. This layer can also be either vacuum evaporated or printed or spin coated or coated through vapor phase deposition process with thickness in the range of 10 nm to 100 nm. Over the hole-injection layer is deposited an anode layer 29d that can be either transparent or reflective (in the illustration of FIG. 02A, the anode layer 29d is transparent). The anode layer is formed over the hole-injection layer 29c either through sputtering or vacuum deposition. The material of the anode layer 29d can be either metal or metal oxide of high work function in the range of 4 eV to 5 eV with a thickness in the range of 50 nm to 500 nm. Over the anode layer 29d is formed an encapsulation layer 29e that acts as a moisture barrier encapsulating the whole stack of organic layers and metal layers (encapsulation is not shown in FIG. 02A). Both the bottom substrate and top substrate are sealed by a hermetic perimeter seal (not shown in FIG. 02A).

External electrical connections to the layers 22, 28 and 29d are brought out for applying two independent voltages $V_1$ and $V_2$. The stack contained between the anode layer 22 and cathode layer 28 is applied with voltage $V_1$. The voltage $V_1$ can be adjusted to control the current through the red and green light emitting layers 25 and 26 that are doped with phosphorescent doping. Similarly the stack contained between anode layer 29d and cathode layer 28 is applied with voltage $V_2$. On application of $V_1$ and $V_2$, the anodes 22 and 29d inject holes in to the stack of layers and the cathode 28 injects electrons in to the stack of layers. The electrons and holes recombine in the host layers 25, 26 and 29a to ultimately generate red, green and blue light. The voltage $V_2$ can be independently adjusted to control the current through the blue light emitting layer 29a that is doped with fluorescent doping. Thus the current through the blue light emitting OLED that is doped with fluorescent doping can be independent of the current through the red and green light emitting OLED that is doped with phosphorescent doping. The life of green and red light emitting layers can be preserved by adjusting low current density (around 7 mA/cm$^2$) through them. At the current density around 7 mA/cm$^2$ the phosphorescent doped layers emit sufficient amount of red and green light. Sufficient amount of blue light can be obtained with blue light emitting layer doped with fluorescent doping by independently adjusting high current density (around 20 mA/cm$^2$) through the fluorescent based blue light emitting layer whose life is satisfactory at the current density around 20 mA/cm$^2$.

External connections can also be changed to drive the two families of OLED from the same source of voltage by incorporating different series resistors to control the current through each family of OLED. The series resistors can be of variable resistor type as well. In the illustration shown in FIG. 02A, the anode layers 22 and 29d, the cathode layer 28 and the substrates 21 and 29f are transparent and hence the white light rays (mix of red, blue and green light) 29g and 29h exit through the substrates 21 and 29f. Since the two families of OLED can be independently driven because of electrical isolation, there is additional advantage of ease of doping the host layers during manufacturing.

Figure 02B:
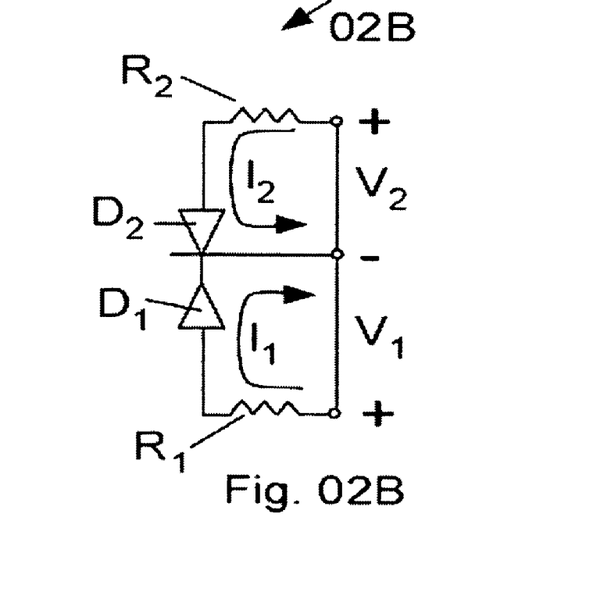

FIG. 02B is the electrical equivalent circuit of the structure shown in FIG. 02A. The OLED belonging to the fluorescent family is represented as $D_2$ and the OLED belonging to the phosphorescent family is represented as $D_1$. $R_2$ is the resistive component of OLED ($D_2$) and $R_1$ is the resistive component of OLED ($D_1$). The current $I_2$ flowing through $D_2$ can be further controlled by having an external resistor and similarly the current $I_1$ flowing through $D_1$ can be further controlled through an external resistor. In addition $V_1$ and $V_2$ can also be adjusted to control the currents. The external resistors can be made out of variable type of resistors. These external adjustments are possible because of the electrical isolation provided in the monolithic novel structure of HW-OLED of the present invention. This structure also enables the variation of blue light in the mixture of red, blue and green light. Thus the color temperature of the resulting white light can be varied. By changing the addition of blue light one can obtain 'cool white' or 'warm white' light. Hence a variable color temperature white OLED lamp can be obtained using the novel structure of the present invention.

Figure 03:
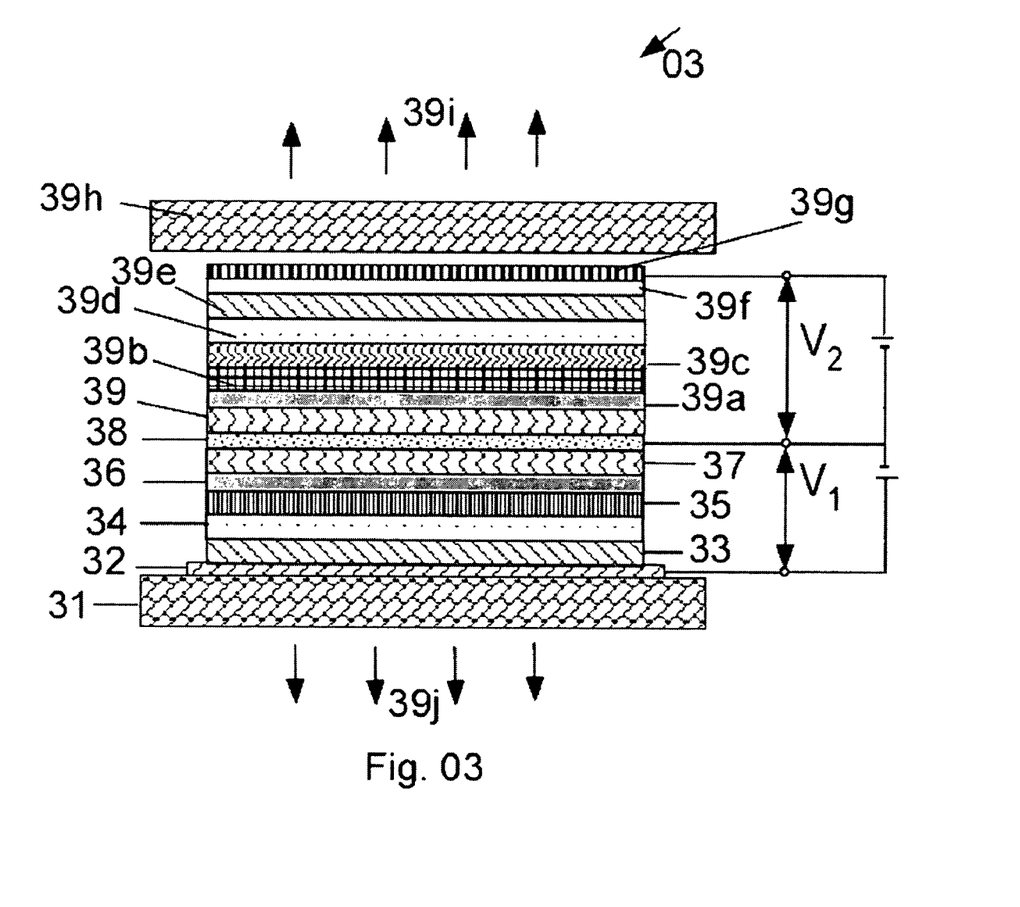

FIG. 03 is another embodiment of the present invention. In this embodiment, the fluorescent doped blue light emitting layer 35 is at the bottom side of the stack as opposed to the embodiment shown in FIG. 02A. In addition there are two hole-blocking layers 36 and 39a that prevent holes reaching electron transport layers 37 and 39.

Organic and inorganic layer sequence in the stack is as follows: 31 is a transparent glass substrate, 32 is a transparent anode, 33 is an organic hole injection layer, 34 is an organic hole transport layer, 35 is an organic fluorescent based blue light emitting layer doped with fluorescent based blue light emitting dopant, 36 is an organic hole blocking layer, 37 is an organic electron transport layer, 38 is a metallic transparent cathode, 39 is an organic electron transport layer, 39a is an organic hole blocking layer, 39b is an organic host layer, belonging to the phosphorescent family, doped with phosphorescent based dopant that emits red light, 39c is an organic host layer, belonging to phosphorescent family, doped with phosphorescent based dopant that emits green light, 39d is an organic hole transport layer, 39e is an organic hole injection layer, 39f is an inorganic transparent anode, 39g is an inorganic passivation or encapsulation layer and 39h is a transparent glass substrate. 39b and 39c can also be combined in to one host layer and doped with a combination of red and green dopants of phosphorescent family to emit a mixture of red and green=yellow light.

When a suitable voltage of $V_1$ is applied to the fluorescent based stack of layers of OLED, the electrons from the cathode are injected in to the electron transport layer 37 and from there reach the host layer 35 after crossing the hole-blocking layer 36. Similarly holes from the anode 32 are injected in to the hole injection layer 33 and from there gets transported through hole transport layer 34 in to the blue light emitting layer 35. The hole-blocking layer 36 prevents holes from leaking out of the host layer 35 and similarly the hole-blocking layer 39a prevents holes from leaking out of 39b. This results in the efficient participation of holes in recombination with electrons inside the host layer. At the host layer 35 the electrons and holes pair themselves to generate excitons and the exciton's energy is transferred to the dopants that get in to excited state and return to their ground state. The transition to the ground state results in light emission characteristic of the dopant molecule. A similar phenomenon happens in the red and green emitting host layers of the phosphorescent family when a sufficient voltage $V_2$ is applied to the stack of layers. The phosphorescent based host layer, with its dopants, emit a combination of red and green light (yellow) and the fluorescent based host layer, with its dopant, emits blue light. The blue light and the yellow light mix well inside the device and gives out white light 39i in the upward direction and 39j in the downward direction because of the transparency of the substrates 31 and 39h, anodes 32 and 39f and cathode 38.

Figure 04A:
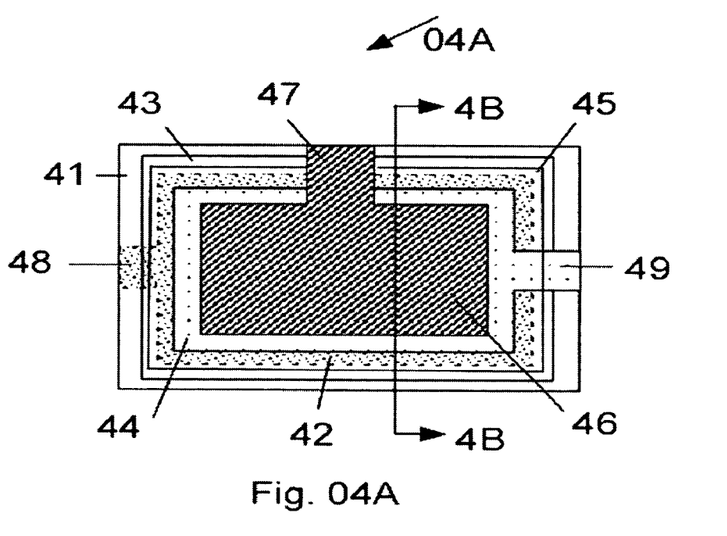
Figure 04B:
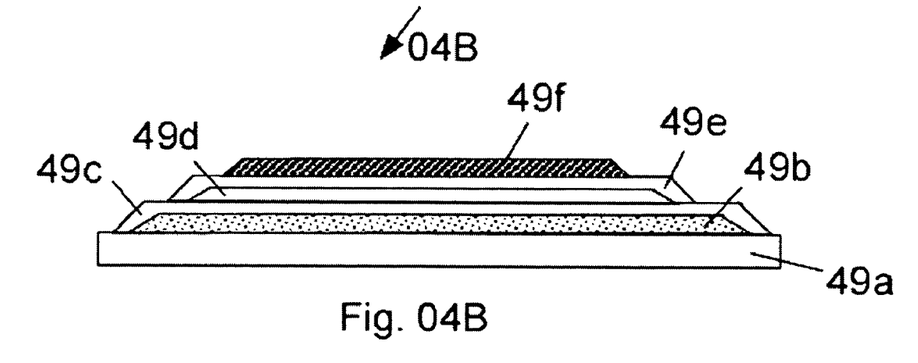

FIG. 04A is the plan view of the layers on a glass substrate in a monolithic fabrication process for fabricating the novel structure of the present invention. For the sake of simplicity all the layers are not shown. The organic layers shown are either deposited by vacuum evaporation or spin coating or printing or through vapor phase deposition process. The inorganic layers like the anode and cathode are deposited through either vacuum evaporation or sputtering process. The starting substrate 41 is of glass over which a transparent anode 42 such as Indium Tin Oxide (ITO) is coated through the use of shadow mask. All the layers shown are coated through shadow masks (not shown in FIG. 04A). The ITO layer is followed by a stack 43 of layers of OLED, belonging to the phosphorescent family, that emits red and green light. Following the stack 43 is a transparent cathode 44, which in turn, is followed by a stack 45, comprising layers that belong to the fluorescent family that emits blue light. Over the blue light emitting stack is deposited a transparent or reflective anode layer 46. The final layer over the 46 is an encapsulating layer (not shown in FIG. 04A). The anode tabs, 47 and 48 and the cathode tab 49 are used for external electrical connection. The cross section taken along the line 4B-4B is shown in FIG. 04B.

FIG. 04B shows the cross sectional view of the section taken from FIG. 04A. The glass substrate 49a contains on its surface a transparent anode 49b followed by a stack 49c of layers of phosphorescent family of OLED for emitting red and green light. The stack 49c is followed by a transparent cathode 49d. Over the cathode 49d is a stack 49e, comprising layers of fluorescent family of OLED for the emission of blue light. The final layer is either transparent anode or reflective anode 49f. (The encapsulation layer is not shown in FIG. 04B).

Figure 05A:
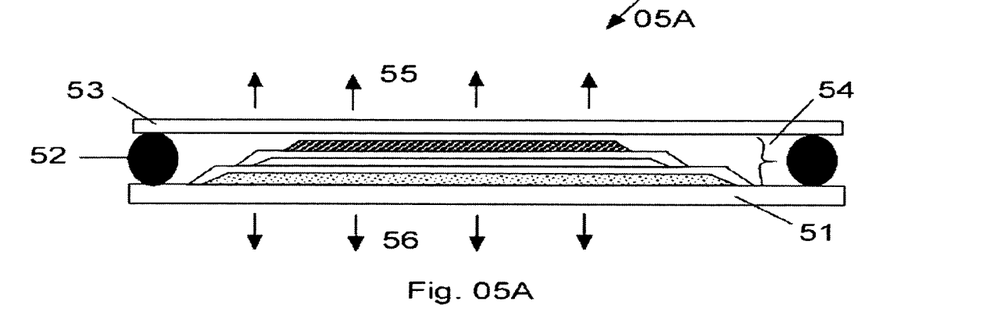

FIG. 05A illustrates the cross section of HW-OLED, according to the present invention, that is hermetically sealed to the cover plate through a peripheral seal. The substrates 53 and 51 are hermetically sealed through a sealant 52 such as an UV epoxy. The OLED structure 54 of the present invention also has a thin film encapsulation layer (not shown in FIG. 05A) that protects the stack of layers from the attack by residual moisture and oxygen. Since the substrates are transparent and the anodes and cathode are transparent, the white light 55 and 56 comes out towards top and bottom respectively.

Figure 05B:
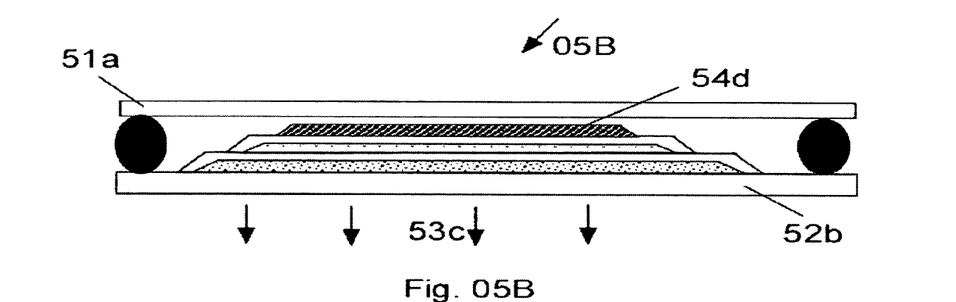

FIG. 05B represents the hermetically sealed device, as in FIG. 05A except that the top anode 54d is reflective and hence the white light 53c exits the bottom side. The two substrates 51a and 52b are sealed hermetically.

Figure 05C:
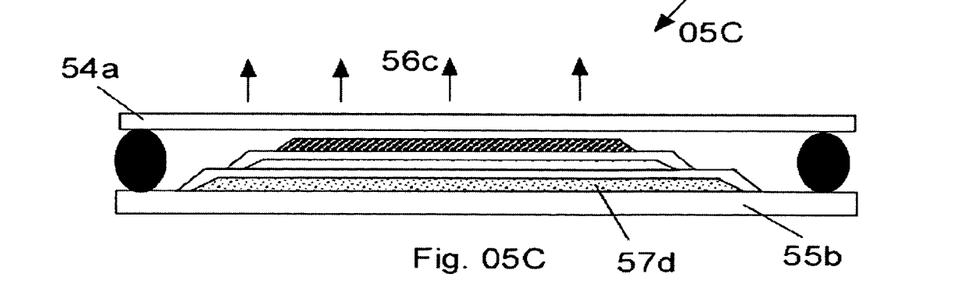

FIG. 05C represents the hermetically sealed device, as in FIG. 05A, except that the bottom anode 57d is reflective and hence the white light 56c exits top side. The two substrates 54a and 55b are sealed hermetically.

The industry has been struggling to find a solution to the HW-OLED for increasing the brightness without impairing the life of phosphorescent based light emitting layer in the stack. The industry's practice is to limit the current through the fluorescent based blue light emitting layer to avoid overloading the phosphorescent based light emitting layer, thus not able to obtain high brightness. The solution was not obvious even to the experts in the field, let alone for a person of ordinary skill in the art. This invention finds a solution to the industry's problem through the monolithic electrical isolation of the fluorescent based light emitting layer from the phosphorescent based light emitting layer.

It will be understood that one skilled in the art could modify the above basic design dimensions, geometries, sequence of layers and assemblies. Various modification and variations can be made in the construction, configuration and/or operation of the present invention without departing from the scope or spirit of the invention. By way of example, the present invention incorporates only the combination of fluorescent and phosphorescent families of OLED in the novel hybrid white OLED structure. One of the families can be replaced with 'Polymer OLED' family or all the three families can be incorporated in the stack with electrical isolation for each. The present invention describes a single unit of the HW-OLED and this can be replaced by multiple units either vertically stacking up or laterally spreading out with series or parallel or series and parallel connections to the OLEDs. The present invention incorporates separate red and green emitting layers of phosphorescent family. This can be replaced by only one host layer of phosphorescent family that can emit a mixture of red and green light which is equivalent to yellow light. The present invention describes the use of monolithic electrical isolation of fluorescent based blue light emitting layer and phosphorescent based red and green emitting layer for creating white light. The emitting layers can be modified to include any of the colors and the resulting creation of color can be any hue of colors of light. The present invention describes rigid glass substrates and these can be replaced by flexible or bendable substrates. The present invention has planar substrates. This can be replaced by substrates that contain micro-structures to extract more light from the device.

Thus it is intended that the present invention covers the modifications and variations of the invention provided they come within the scope of the appended claims and their equivalents.

I claim:

1. A hybrid organic light emitting diode for use in general illumination and flat panel display, and said organic light emitting diode comprising:
   a stack of organic thin film layers and inorganic thin film layers of anodes and cathode, contained between two optically transparent flat substrates;
   wherein the said stack of layers further comprising, among several layers, three light emitting layers making up two families of organic light emitting diodes;
   said two families of organic light emitting diodes of which one belonging to the phosphorescent family, based on dopants of heavy metal-atom-complex, of organic light emitting diode and the other belonging to the fluorescent family, based on small molecule, of organic light emitting diodes;
   said fluorescent family of organic light emitting diode comprising at least one blue light emitting layer;
   said phosphorescent family of organic light emitting diode comprising two light emitting layers of which one layer is for emitting red light and the other layer is for emitting green light;
   said two families of organic light emitting diodes electrically isolated from each other;
   wherein the said fluorescent family of organic light emitting diode and the said phosphorescent family of organic light emitting diode, when applied with suitable voltage, conducting currents independent of each other;
   upon conducting currents the said fluorescent family of organic light emitting diode emitting blue color light and the said phosphorescent family of organic light emitting diode emitting red and green color light;

wherein the said red, the said blue and the said green color lights, after mixing inside the said hybrid organic light emitting diode device, exit the said device as white light.

2. A hybrid organic light emitting diode as claimed in claim 1 further including conductive tabs for external electrical connection to the anodes and cathode.

3. A hybrid organic light emitting diode as claimed in claim 2 wherein the said two families of organic light emitting diodes can be electrically driven, independently, with two different sources of voltage and the current through the said families of organic light emitting diodes can be adjusted to obtain required light flux from each of the said families of organic light emitting diodes.

4. A hybrid organic light emitting diode as claimed in claim 1 wherein the position of the said blue light emitting layer and the position of the said red light emitting layer and the position of the said green light emitting layer can be changed in the sequence in the said stack of said organic layers.

5. A hybrid organic light emitting diode as claimed in claim 1 wherein the said substrates are flexible, bendable or rigid.

6. A hybrid organic light emitting diode as claimed in claim 1 wherein one of the said anodes can be optically reflective or transparent.

7. A hybrid organic light emitting diode as claimed in claim 1 wherein the said cathode is optically transparent.

8. A hybrid organic light emitting diode as claimed in claim 1 wherein the white light exits the top and bottom side of the said hybrid organic light emitting diode or one of the sides of the said hybrid organic light emitting diode.

9. A hybrid organic light emitting diode as claimed in claim 1 wherein the said blue light emitting layer contains dopant material of the said fluorescent family of organic light emitting diode and the said red and green light emitting layers contain dopant materials of the said phosphorescent family of organic light emitting diode.

* * * * *